(12) United States Patent
Chang et al.

(10) Patent No.: US 6,536,592 B1
(45) Date of Patent: Mar. 25, 2003

(54) TRANSPORTABLE CONTAINER HAVING AN INDICATOR

(75) Inventors: Yu-Yen Chang, Taipei (TW); Kuo-Cheng Lin, Hsinchu (TW)

(73) Assignee: Taiwan Semiconductor Manufacturing Company Ltd. (TW)

( * ) Notice: Subject to any disclaimer, the term of this patent is extended or adjusted under 35 U.S.C. 154(b) by 133 days.

(21) Appl. No.: 09/723,404

(22) Filed: Nov. 27, 2000

(30) Foreign Application Priority Data

Oct. 5, 2000 (TW) ...................................... 89217316 U

(51) Int. Cl.[7] .............................................. B65D 51/00
(52) U.S. Cl. ........................ 206/459.1; 206/710; 70/63; 70/432
(58) Field of Search ...................... 70/63, 432; 206/1.5, 206/459.1, 459.5, 710–712

(56) References Cited

U.S. PATENT DOCUMENTS

| | | | | |
|---|---|---|---|---|
| 5,915,562 A | * | 6/1999 | Nyseth et al. | ............... 206/710 |
| 5,957,292 A | * | 9/1999 | Mikkelsen et al. | ......... 206/710 |
| 6,186,331 B1 | * | 2/2001 | Kinpara et al. | ............. 206/711 |
| 6,340,933 B1 | * | 1/2002 | Chen et al. | ................... 70/432 |

* cited by examiner

*Primary Examiner*—Jim Foster
(74) *Attorney, Agent, or Firm*—Blakely Sokoloff Taylor & Zafman

(57) ABSTRACT

The SMIF pod includes a base having a cassette that may receive one or more wafers in preparation for transferring the wafers. The base includes a plurality of first openings formed on the side surfaces for a latch mechanism. The base includes a window formed on a surface of the base for an operator to read the state of the container. A box having second openings one to one corresponding to said first openings for the latch mechanism with latch member to penetrate through them while in the lock state. An indicator presents a first mark for indicating the locked state at the window or presents a second mark at the window for indicating the unlocked state.

18 Claims, 6 Drawing Sheets

TRANSPORTABLE CONTAINER HAVING AN INDICATOR

FIELD OF THE INVENTION

The present invention relates to a transportable container for facilitating article transportation, and particularly, to a transportable container having an indicator for facilitating semiconductor wafer fabrication, and in particular to a pod to transfer wafers between process stations.

BACKGROUND OF THE INVENTION

With the rapid advancement in the semiconductor package technology, designers are always tempted to scale the size of the package down. The industry of the package is striving to reduce the size and increase their speed simultaneously. An important consideration in making small, high speed and high-density devices is to provide packages that are capable of the spreading heat generated by the devices.

In general, any larger sizes particles can be very damaging to the semiconductor processing because of the feature size of the semiconductor devices is very small Undesired contamination particles substantially damage the product yield of the semiconductor devices. A SMIF (standard mechanical interface system) system is proposed to reduce particle on the semiconductor wafers during storage and transport of the wafers between the fabrication processes. The SMIF system provides a clean environment for articles. Further detail of disclosed prior art is described in the U.S. Pat. No. 4,532,970.

The system employs sealed pods for storing and transporting wafer cassettes. A sealed pod includes a top cover mating with a base. The wafers generally are seated within a wafer cassette that rests inside the pod. In order to transfer a wafer cassette from a source station to a destination in terms of SMF system. A pod is typically placed on a load port of the source station. After the destination is arrived, the cassette released from the load port, thereafter wafers are picked successively into the processing chamber by a robot.

Typically, the pod carry one or more cassette for transferring the wafers into the processing station. The cassette includes a structure for holding one or more wafer, which includes an open end from which the wafers may be inserted and extracted. A latch mechanism is provided within the base of the pod to control the latched on or off state of the pod door. The latch mechanism of the pod may include a cam kit, and a latch member. The latter has four keys and couples to the cam kit. The pod door is to ensure the four keys could be holding on the lock position when the cam is rotating into the end position.

However, the pod may be dropped to ground due to the door of the pod is not securely locked by the latch mechanic the cam does not complete the rotation and keep the cam staying at the end position, any violent motion may swing the four keys back to the unlock position. In this situation, it may cause the pod door to release from the pod base. The incident event occurred several times in the Fab.

What is needed is a transportable container having an indicator to indicate the pod door locked state.

SUMMARY OF THE INVENTION

The object of the present invention is to provide a container or pod having an indicator for SMIF.

The SMIF pod includes a base having a cassette that may receive one or more wafers in preparation for transferring the wafers. The base includes a plurality of first openings formed on the side surfaces for a latch mechanism. The base includes a window formed on a surface of the base for an operator to read the state of the container. A box top having second openings one to one corresponding to said first openings for the latch mechanism with latch member to penetrate through them while in the lock state. An indicator presents a first mark for indicating the locked state at the window or presents a second mark at the window for indicating the unlocked state.

The first mark and the second mark are coded on a rack, which is a member of the indicator. Another member of the indicator is a gear set coupled with the rack and the latch mechanism. The rack moving in a forward or backward direction is in response to the state of the latch mechanism.

Preferably, at least a first color and a second color marked on a terminal of the rack to indicate the state of the container or the SMIF pod. Alternatively, the mark may be presented by text or symbol in lieu of color.

DETAILED DESCRIPTION OF THE PREFERRED EMBODIMENT

Figure 1:
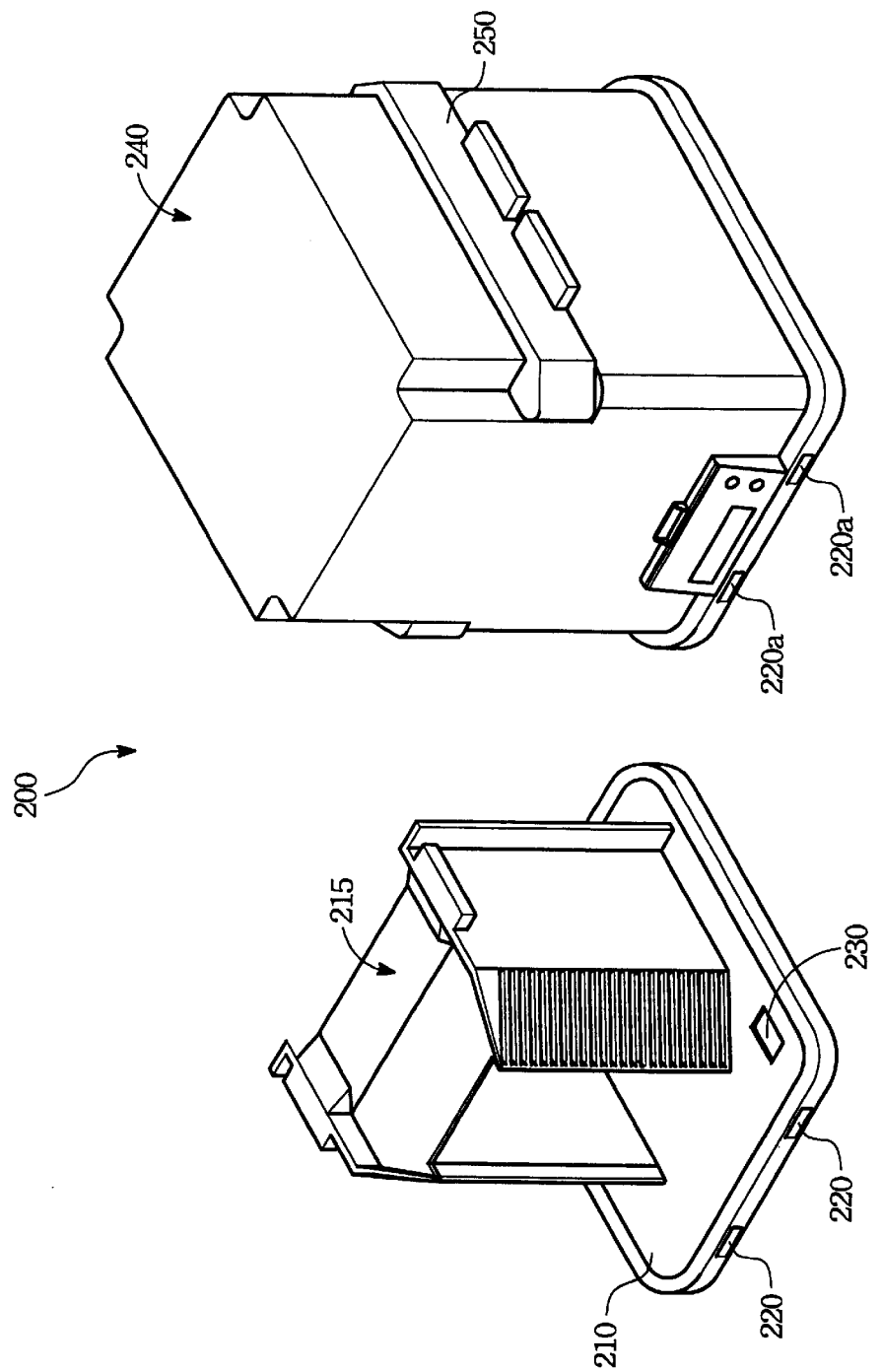
FIG. 1 is a three-dimension structure according to the present invention.
Figure 2:
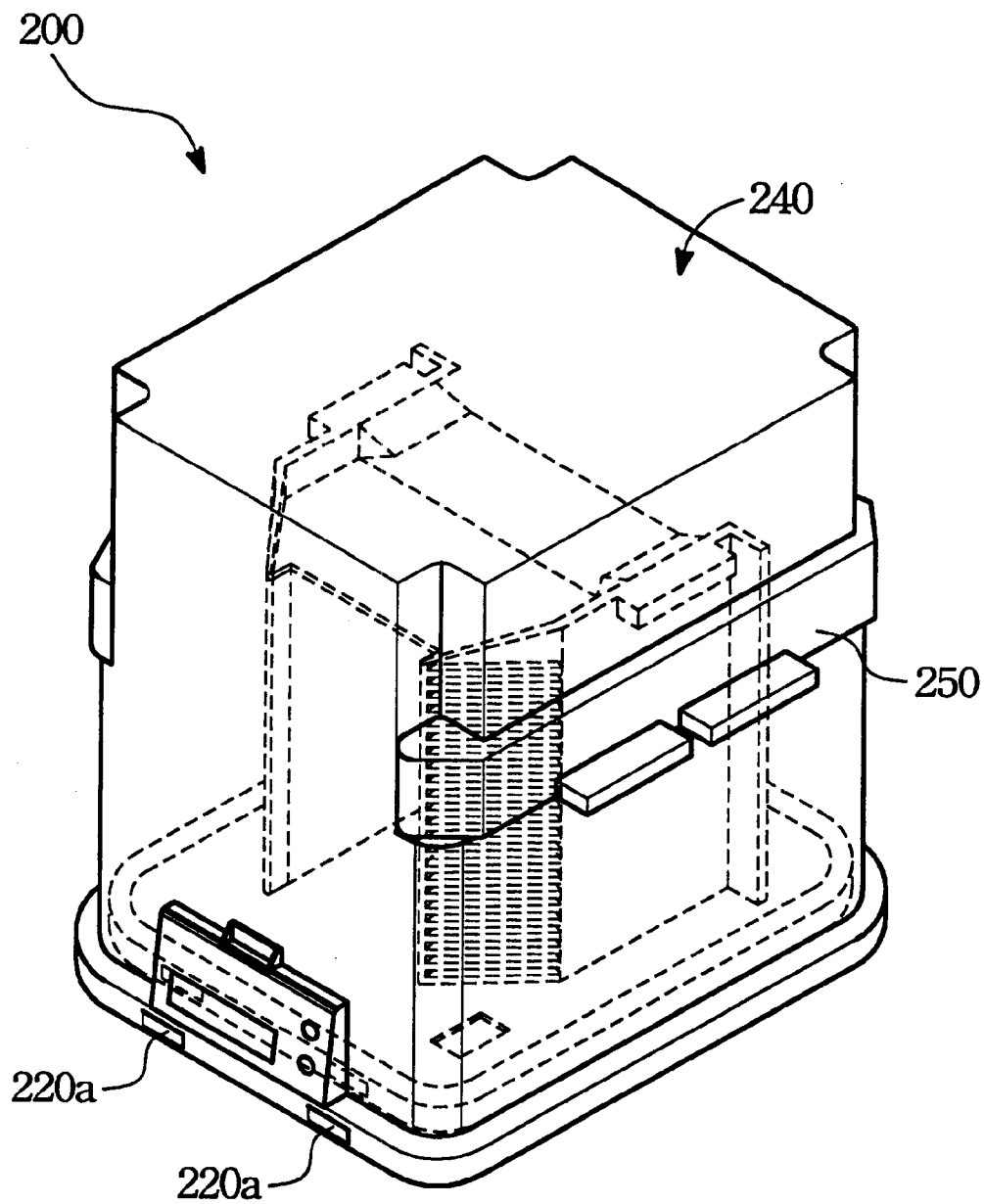
FIG. 2 is a three-dimension structure according to present invention.

The present invention discloses a structure of a transportable container having indicator for transferring articles. The container may be used to transfer such as but not limited to the semiconductor wafers. Referring to FIG. 1 in conjunction with FIG. 2, the transportable container 200 includes a base 210 for carrying article. For this embodiment, the base 210 carry a cassette 215 that may receive one or more wafers to a processing station or a buffer station. The cassette 215 is well known in the art, the detailed descriptions are omitted. A latch mechanism is set within the base 210. A plurality of openings 220 is formed at the side surface of the base 210 for the keys of the latch mechanism to penetrate through the openings 220 and openings 220a of a box top 240, thereby locking the door of the container 200 for security.

A window 230 is formed on the upper surface of the base for the operator to monitor the latched sate of the latched mechanism. The function of the window 230 will be given detailed later. The box top 240 is preferably made of transparent material so that the operator may see the content inside it, particularly the window 230. The second openings 220a formed on a lower portion of the box top 240 are designed to align with the previous openings 220 when the box 240 is placed on the top of the base 210. The box top 240 is thereafter mounted on the surface of the base 210 by the latch mechanism. A pair of handle 250 is set on the side-wall of the box top 240 for an operator to handle the container.

Figure 3:
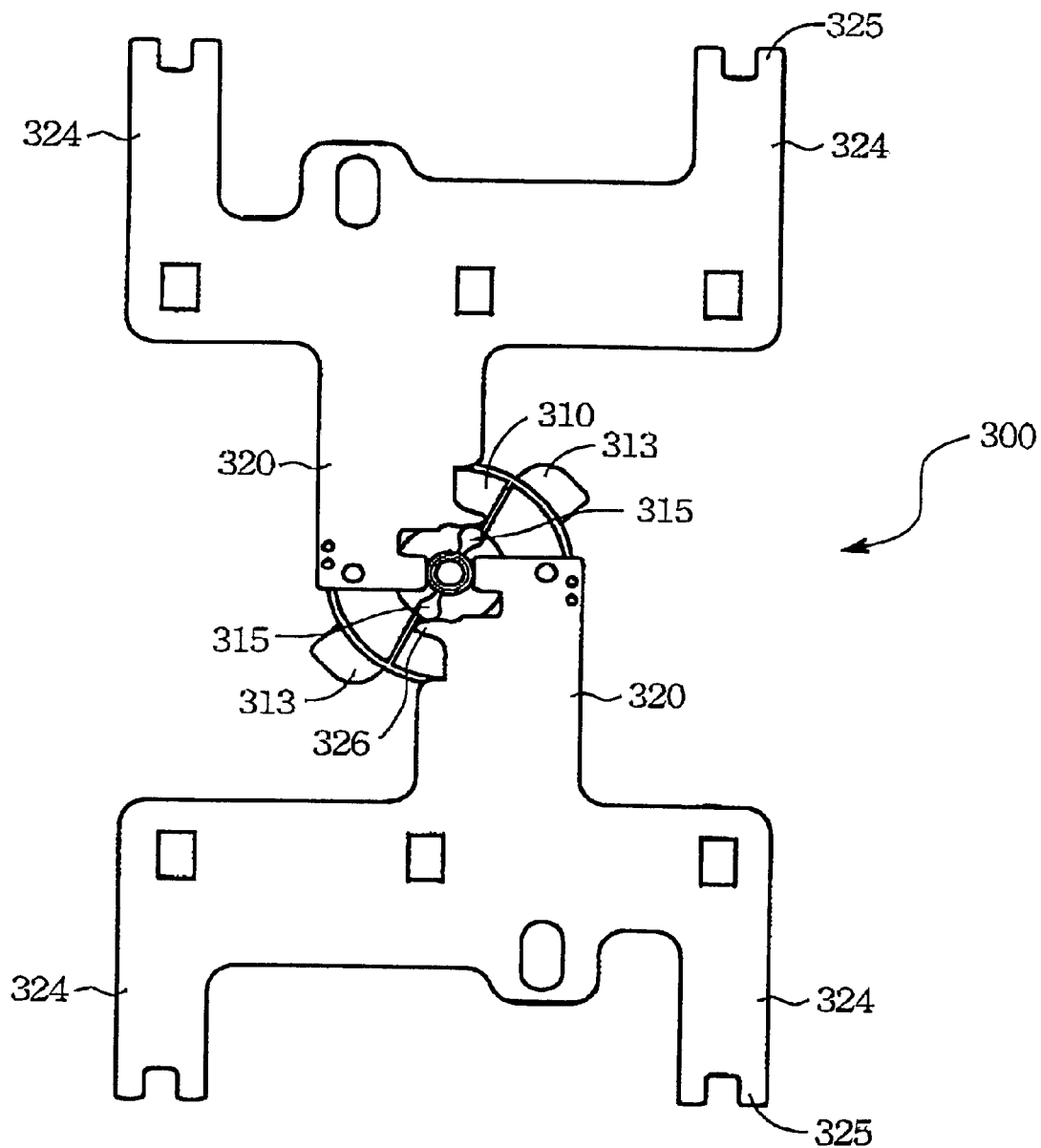
FIG. 3 is a front side view illustrating a latch mechanism according to present invention.
Figure 4:
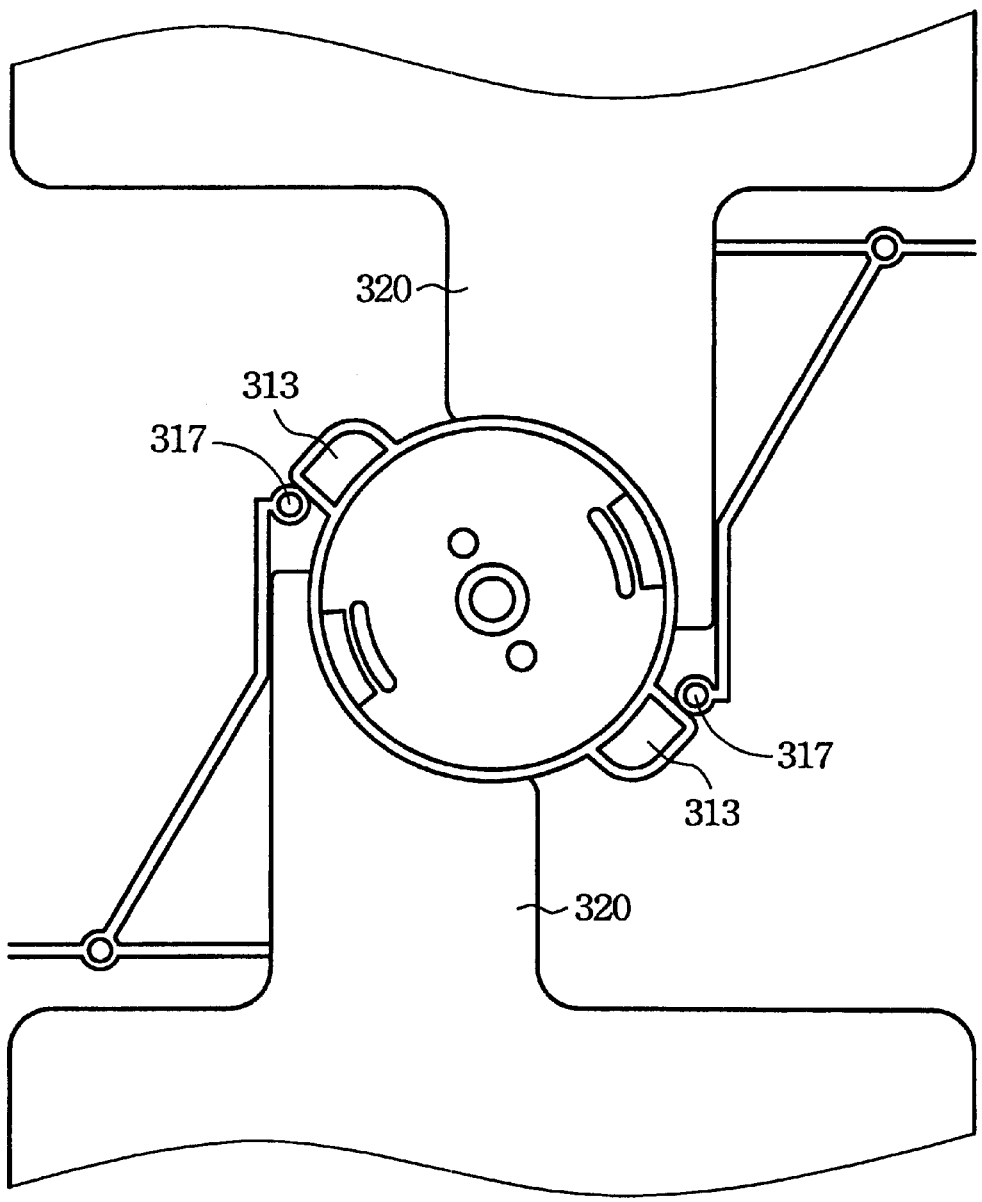
FIG. 4 is a reverse side view illustrating latch mechanism according to present invention.
Figure 5:
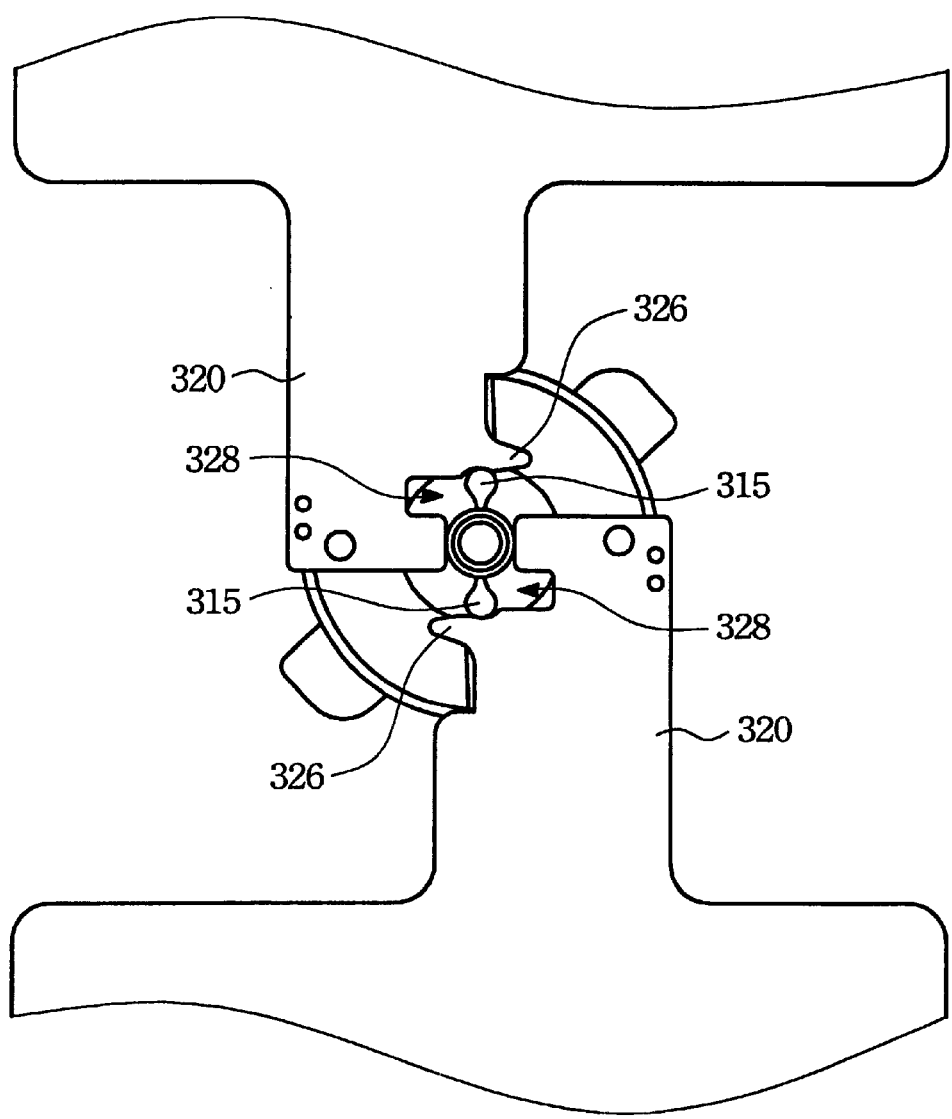
FIG. 5 is a reverse side view illustrating latch mechanism according to present invention.

The box door latch mechanism 300 (see FIG. 3 to FIG. 5) having pins 315 to trigger the box door latch mechanism 300 and thereby releasing box top 240 from the base 210 or fixing the box top 240 onto the base 210. Wafers can then be moved to the proper position in the processing equipment for processing. The major part of the latch mechanism 300 includes a cam 310 and two latch members 320. Preferably, the cam 310 is a disc like having wings 313 formed at the edge thereof. A pair of stoppers 317 formed on the surface of the base 210 is to stop the cam 310 from rotating when the cam 310 is rotating to a lock position by using the stopper 317 blocking the wings 313 motion. The pins formed adjacent to a cam shaft 330 315 will force the latch members 320 to move in a upward or a downward direction, and make the keys 325 penetrate through the first openings 220 of the base 210 and the second openings 220a of the box top 240, thereby locking the box top 240 to the base 210. On the contrary, the box top 240 will be released.

As mentioned above, the container 200 includes a box top 240 mating with the base 210. The wafers generally are seated within a wafer cassette that rests inside the container 200. In order to transfer a wafer cassette from a first station to a second processing station. The latch mechanisms within the base 210 have to lock the box top 240 to the base 210 or release the box top 240 from the base 210 after finish transportation. Thereafter, the wafers are then transferred into the processing chamber by a robot.

Each one of the pair of latch members 320 includes a main body having at least one finger 324. Preferably, it 320 have four fingers. Each finger 324 includes a key 325 to penetrate aforementioned openings 220, 220a when the cam is driven to the lock position. In this state, the pins 315 of the cam push the protruding fins 326 of the latch members 320, thereby driving the latch members to move toward predetermined directions. The protruding fins 326 are set to mate the pins 315 of the cam 310. When the box top 240 is desired to release from the base 210, the cam 310 rotated at an opposite rotating direction with respect to the lock of the box top 240. In this situation, the pins 315 force the latch member 320 moving backward by pushing the recessed portions 328 of the latch member 320.

The cam 310 has pins 315 extending out of the surface and the latch member 320 has four keys 325. The latch member 320 locks or releases the box top 240 depending on the rotation direction of the cam 310. The container 200 is designed to ensure the four keys 325 could be hold into the lock position when the cam is rotated into the lock position. Then, the four keys 325 are protruding out of openings 220, 220a to lock the box top 240 onto the base 21.

The SMIF pod or container has an indicator in response to the lock state by presenting a first mark Further, the indicator is in response to an unlock state by presenting a second mark The indicator can be read through the window 230.

Figure 6:
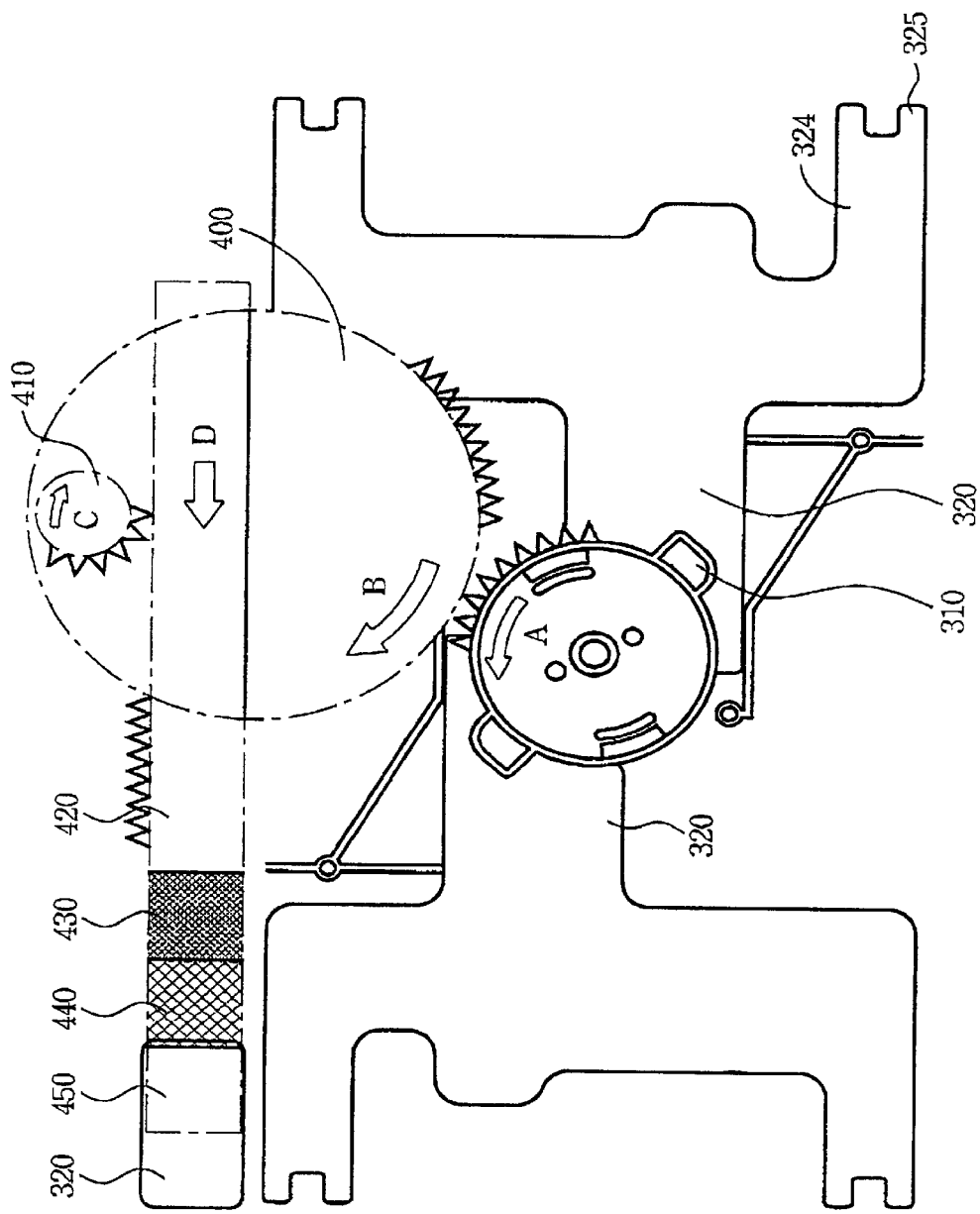
FIG. 6 is an indicator structure according to present invention.

Turning to FIG. 6, the container 200 includes an indicator, which preferably includes a gear set and a rack. The rack may move backward or forward depending on the gear set and the cam driven. Preferably, the gear set includes a first gear 400 with teeth is clenched to a zigzag structure 350 formed at the fringe of the cam 310. A second gear 410 is mounted on the first gear 400. A rack 420 having zigzag structure clench to the second gear 410. As know in the art, the physical structure, and dimension of the zigzag structure of the above members has to match each other. A terminal of the rack 420 includes at least two maker areas 430 to indicate the lock on or off state of the latch mechanism 320. Preferably, it may include three marker areas. The marker areas each may have text, symbol, or color formed thereon to express a predetermined state of the latch mechanism. In a preferred embodiment, at least two colors are coated on the terminal of the rack 420, which represent, respectively, the locked (safe) state and un-locked (danger) state. For example, to lock the box top 240, the cam 310 is rotated in counter-clockwise to force the keys 325 protruding out of the opening 220, and 220a, as a result, the first gear 400 is driven in clockwise direction indicated by an arrow B. And the second gear 410 is in response to the motion of the first gear 400 to rotate at the same direction as the first gear 400 indicated by an arrow C. The rack 420 is thus move along the direction represented by an arrow D, thereby presenting the color area represented the "locked state." The "locked state" may be read via the window 230. On the contrary, the second color 440 or/and third color 450 may be read through the window 230 when the cam is in the un-locked or unsafe position.

As is understood by a person skilled in the art, the foregoing preferred embodiments of the present invention are illustrated of the present invention rather than limiting of the present invention. It is intended to cover various modifications and similar arrangements included within the spirit and scope of the appended claims, the scope of which should be accorded the broadest interpretation so as to encompass all such modifications and similar structure. Thus, while the preferred embodiment of the invention has been illustrated and described, it will be appreciated that various changes can be made therein without departing from the spirit and scope of the invention.

The embodiments of the invention in which an exclusive property or privilege is claimed are defined as follows:

1. A container having an indicator comprising:
    a base for carrying an article, wherein said base includes a plurality of first openings formed on side surfaces of said base, said base including a window formed on an upper surface of said base for an operator to read the locked state or unlocked state of said container;
    a box top mating with said base and having a plurality of second openings corresponding to said first openings to provide a latch mechanism to lock said box top to said base while in a locked state by means of latched members of said latch mechanism penetrating said first openings and second opening; and
    an indicator presenting a first mark at said window to indicate the locked state or presenting a second mark at said window to indicate an unlocked state.

2. The container of claim 1, wherein said indicator comprising:
    a gear set rotating in response to said latch mechanism; and
    a rack coupling with said gear set to move in a first direction or a second direction to present said first mark or said second mark for indicating the locked state or the un-locked of said container.

3. The container of claim 2, wherein said first mark and said second mark is formed on said rack and presented by a form of colors to indicate the locked or the unlocked state of said container.

4. The container of claim 2, wherein said first mark and said second mark is formed on said rack and presented by a forms of texts to indicate the locked or the unlocked state of said container.

5. The container of claim 2, wherein said first mark and said second mark is formed on said rack and presented by a forms of symbols to indicate the locked or the unlocked state of said container.

6. The container of claim 2, wherein said gear set includes a first gear and second gear coupled each other, said rack clenching to said second gear.

7. The container of claim 1, wherein said latch mechanism comprising:

a cam shaped as a disc shape having wings formed at the edge, a pair of stoppers is formed on a surface of said base to stop said cam rotate by using said stopper to block said wings when said cam is rotated to a position of lock, a pair of pins is formed on said cam to force a pair of latch members to lock or release said box top;

wherein each one of said pair of latch members includes a main structure having at least one finger, said at least one finger includes keys at a terminal to penetrate said first and second openings when said cam is driven to the locked state.

8. The container of claim 7, wherein said indicator comprising:

a gear set rotating in response to said cam; and a rack coupling with said gear set to move in a first direction or a second direction to present said first mark or said second mark for indicating the locked state or the un-locked state of said container.

9. The container of claim 8, wherein said gear set includes a first gear and second gear coupled to said first gear, said rack clenching to said second gear.

10. The container of claim 8, wherein said first mark and said second mark is formed on said rack and presented by a form of colors to indicate the locked or the unlocked state of said container.

11. The container of claim 8, wherein said first mark and said second mark is formed on said rack and presented by a form of texts to indicate the locked or the unlocked state of said container.

12. The container of claim 8, wherein said first mark and said second mark is formed on said rack and presented by a form of symbols to indicate the locked or the unlocked state of said container.

13. A container having an indicator comprising:

a base having cassette that may receive one or more wafers in preparation for transferring of said wafers into a processing station or a buffer station, wherein said base includes a plurality of first openings formed on side surfaces of said base;

a box top mating with said base and having a plurality of second openings corresponding to said first openings to provide a latch mechanism to lock said box top onto said base while in a locked state by means of latched members of said latch mechanism penetrating said first openings and second opening; and;

an indicator presenting a first mark at said window to indicate the locked state or presenting a second mark at said window to indicate the unlocked state; and wherein said indicator comprises a gear set rotating in response to said latch mechanism, and a rack moving in response to said gear set so as to present said first mark or said second mark.

14. The container of claim 13, wherein said latch mechanism includes a cam shaped as a disc shape having wings formed at the edge, a pair of stoppers is formed on a surface of said base to stop said cam rotate by using said stopper to block said wings when said cam is rotated to a position of lock, a pair of pins is formed on said cam to force a pair of latch members to lock or release said mating box;

wherein each one of said pair of latch members includes a main structure having at least one finger, said at least one finger includes keys at a terminal to penetrate said first and second openings when said cam is driven to said lock state.

15. The container of claim 13, wherein said gear set includes a first gear and second gear coupled to said first gear, said rack coupling to said second gear.

16. The container of claim 13, wherein said first mark and said second mark is formed on said rack and presented by a form of colors to indicate the locked or the unlocked state of said container.

17. The container of claim 13, wherein said first mark and said second mark is formed on said rack and presented by a form of texts to indicate the locked or the unlocked state of said container.

18. The container of claim 13, wherein said first mark and said second mark is formed on said rack and presented by a form of symbols to indicate the locked or the unlocked state of said container.

* * * * *